(12) United States Patent
Chen

(10) Patent No.: US 11,658,680 B2
(45) Date of Patent: May 23, 2023

(54) LOSSLESS COMPRESSION AND DECOMPRESSION METHOD FOR TEST VECTOR

(71) Applicant: SHANGHAI NCATEST TECHNOLOGIES CO., LTD., Shanghai (CN)

(72) Inventor: Ting Chen, Shanghai (CN)

(73) Assignee: SHANGHAI NCATEST TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 17/426,116

(22) PCT Filed: Sep. 15, 2020

(86) PCT No.: PCT/CN2020/115359
§ 371 (c)(1),
(2) Date: Jul. 28, 2021

(87) PCT Pub. No.: WO2021/052329
PCT Pub. Date: Mar. 25, 2021

(65) Prior Publication Data
US 2022/0200624 A1 Jun. 23, 2022

(30) Foreign Application Priority Data
Sep. 16, 2019 (CN) .......................... 201910871722.7

(51) Int. Cl.
*H03M 7/40* (2006.01)
*H03M 7/30* (2006.01)

(52) U.S. Cl.
CPC ............... *H03M 7/40* (2013.01); *H03M 7/70* (2013.01)

(58) Field of Classification Search
CPC ........ H03M 7/40; H03M 7/70; H03M 7/3086; H03M 7/30
USPC .......................................................... 341/67
See application file for complete search history.

(56) References Cited

U.S. PATENT DOCUMENTS

| 5,001,418 A * | 3/1991 | Posse .................... G06F 11/277 324/763.01 |
| 5,191,548 A * | 3/1993 | Balkanski .............. H04N 19/42 708/319 |
| 5,196,946 A * | 3/1993 | Balkanski .............. H04N 19/60 382/277 |

(Continued)

*Primary Examiner* — Jean B Jeanglaude
(74) *Attorney, Agent, or Firm* — Tianchen LLC.; Yuan R. Li; Yi Fan Yin

(57) ABSTRACT

A lossless compression method for a test vector has following steps: S01: converting the test vector into a data stream with A rows and B columns, the data stream is expressed in binary; S02: compressing the data stream a column by a column sequentially to form compressed words and uncompressed words corresponding to test datum of each of the B columns; a compression method for the test datum of each of the B columns comprises: setting a window with a width of 1 bit and a depth of M rows, and sliding the window down a row by a row from top of test datum of a column, and forming the compressed words and the uncompressed words corresponding to the test datum of each of the B columns; S03: converging the compressed datum of the test datum of each of the B columns to form a compressed data stream.

9 Claims, 5 Drawing Sheets

(56) References Cited

U.S. PATENT DOCUMENTS

| | | | | |
|---|---|---|---|---|
| 5,270,832 A | * | 12/1993 | Balkanski | H04N 19/42 |
| | | | | 382/250 |
| 5,341,318 A | * | 8/1994 | Balkanski | H04N 19/60 |
| | | | | 358/426.14 |
| 6,693,961 B1 | * | 2/2004 | Azadegan | H04N 19/90 |
| | | | | 375/E7.206 |
| 9,195,695 B2 | * | 11/2015 | Yates | G06F 16/1744 |
| 2008/0222136 A1 | * | 9/2008 | Yates | G06F 16/2365 |
| | | | | 707/999.005 |
| 2011/0307233 A1 | * | 12/2011 | Tseng | G06F 30/33 |
| | | | | 703/21 |

* cited by examiner

LOSSLESS COMPRESSION AND DECOMPRESSION METHOD FOR TEST VECTOR

CROSS-REFERENCE TO RELATED APPLICATION

This application claims priority of International Patent Application Serial No. PCT/CN2020/115359, filed Sep. 15, 2020, which is related to and claims priority of Chinese patent application Serial No. 201910871722.7 filed on Sep. 16, 2019. The entirety of each of the above-mentioned patent applications is hereby incorporated herein by reference and made a part of this specification.

TECHNICAL FIELD

The disclosure relates to the technical field of data compression and decompression, and particularly to a lossless compression and decompression method for a test vector.

BACKGROUND

Data compression in the prior art includes lossy compression and lossless compression. The lossy compression takes advantage of insensitivity of human beings to some frequency components in image or sound wave, which allows loss of certain information in a compression process; although the lossy compression cannot completely restore original datum, lost datum has little effect on understanding of the original datum for original image, so as to gain a much larger compression ratio. The lossless compression is a compression of a file itself, which is the same as compressions of other data files and optimizes a data storage method of the file, by using an algorithm to represent repeated datum, the file can be completely restored without affecting the content of the file. For digital images, there will be no loss of details of image datum.

In field of ATE (Automatic Test Equipment) testing, compressed datum are chip test vectors and must be compressed losslessly. A current mainstream lossless compression algorithm is a LZ77 series, which uses Huffman coding technology and requires use of a dictionary for compression and decompression to achieve an extremely high compression effect. However, though the lossless compression algorithm mentioned above is suitable for implementation on a CPU but not convenient for implementation on FPGA and ASIC (Application Specific Integrated Circuit).

Therefore, for the field of ATE testing, industry urgently needs a lossless compression algorithm which can perform real-time compression of data streams without using a dictionary to facilitate implementation on FPGA, thus compression rate is no longer a major indicator that must be considered.

SUMMARY

The purpose of the present invention is to provide a lossless compression and decompression method for a test vector. The compression method is simple and fast and can be applied to field of ATE testing.

In order to achieve the above objective, the present invention adopts following technical solution: a lossless compression method for a test vector comprises following steps:

S01: converting the test vector into a data stream with A rows and B columns, the data stream is expressed in binary; wherein each of the B columns represents test datum of a test channel at a time differently; each of the A rows represents test datum of a test channel differently at the same time; both A and B are integers greater than 1;

S02: compressing the data stream a column by a column sequentially to form compressed words and uncompressed words corresponding to test datum of each of the B columns; a compression method for the test datum of each of the B columns comprises:

S021: setting a window with a width of 1 bit and a depth of M rows, and sliding the window down a row by a row from top of test datum of a column, during adding M−1 bits of datum to the window, if both 0 and 1 in the M−1 bits datum, compression is not performed, so as to form M bits of the uncompressed words, wherein in the uncompressed words, M−1st bit data represents a compression mark, and datum from M−2nd bit to 0th bit represent the M−1 bits of the datum correspondingly in the window;

if either 0 or 1 in the M−1 bits datum, the compression is performed, and the window is pulled down a row by a row continually until a data added latest in the window is different from test datum in other rows in the window or pulled down to bottom of the test datum of the column to form M bits of the compressed words, wherein, M−1st bit data in the compressed words represents the compression mark, M−2nd bit data represents a compressed character, datum form M−3rd bit to 1st bit represent cnt, which is number of compressed characters in the M−1 bits of the datum; 0th bit data represents the mantissa of the data added latest in the window;

S022: after forming the compressed words or the uncompressed words, sliding the window to an unprocessed row of the test datum of the column, and repeating step S021 until the window is pulled down to the bottom of the test datum of the column to form compressed datum of the test datum of each of the B columns; M is a positive integer greater than 2 and less than A;

S03: converging the compressed datum of the test datum of each of the B columns to form a compressed data stream.

Further, between step S01 and step S02, further comprises: dividing the data stream with the A rows and the B columns into N slices, and each of the N slices comprises a data stream with A/N rows and B columns, in step S02, the N slices are compressed respectively by N compression units to form N compressed data modules; A/N is a positive integer greater than M.

Further, in step S03, arranging the N compressed data modules in an order of the N slices, and separating the N compressed data modules corresponding to adjacent slices by inserting compression marks.

Further, compression marks in the compressed words is different from compression marks in the uncompressed words.

Further, in step S021, during sliding the window down a row by a row, the data added latest in the window is the same as datum in other rows in the window, and the number of the compressed characters (cnt) plus 1.

A lossless decompression method for a test vector compressed comprises following steps:

T01: decompressing the compressed datum of the test datum of each of the B columns in a column order of the B columns, comprising:

for the uncompressed words, after removing the M−1 st bit data, remaining datum from the M−2nd bit to the 0th bit are decompressed datum;

for the compressed words, extending the compressed characters in the compressed words to cnt bit, and plus the mantissa of the 0th bit data in the compressed words to form the decompressed datum;

converging the decompressed datum of the test datum of each of the B columns in the order of the B columns to form column datum of decompressed datum after decompression;

T02: repeating step T01 to obtain B columns of the column datum and converging the B columns of the column datum to form the data stream with the A rows and the B columns.

Further, during a compression, dividing the data stream with the A rows and the B columns into N slices, and each of the N slice comprises a data stream with A/N rows and B columns, the N slices are compressed respectively by N compression unit to form N compressed data modules; A/N is a positive integer greater than M;

in step T01, the N compressed data modules are decompressed respectively by N decompression units to form N decompressed data modules correspondingly.

Further, before step T01, further comprises receiving the N compressed data modules, wherein, during receiving each of the compressed data module, bit numbers of the compressed words and the uncompressed words received sequentially are analyzed, if bit numbers of the compressed words and the uncompressed words received sequentially are equal to A/N, thus both the compressed words and the uncompressed words received are test datum of a column, wherein, the bit number of the uncompressed words is equal to M−1 bit, and the bit number of the compressed words is equal to the number of compressed characters in the compressed word (cnt) plus 1.

Further, decompressing each of the N compressed data modules a row by a row sequentially, and splicing the column datum of decompressed datum correspondingly by the N decompressed data modules seamlessly after the decompression to form the column datum of the decompressed datum corresponding to the columns.

The beneficial effects of the present invention are: the present invention provides a method for lossless compression and decompression of a test vector, which utilizes the feature of the ATE test vector is the high inheritance along the column direction, and adopts a compression algorithm of the data stream sliding along the column direction, which can realize lossless compression and decompression, and processes of the compression and the decompression are simple and fast, thus are suitable for field of ATE testing.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Figure 1:
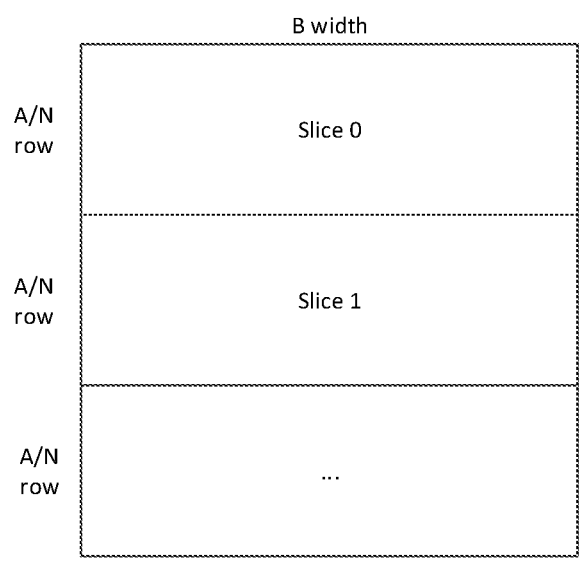
FIG. 1 is a schematic diagram of dividing a data stream into N slices in Embodiment 1.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

It is to be understood that "first," "second" and similar terms used in the specification and claims are not to represent any sequence, number or importance but only to distinguish different parts. Likewise, similar terms such as "a" or "an" also do not represent a number limit but represent "at least one". It is also to be understood that term "and/or" used in the present disclosure refers to and includes one or any or all possible combinations of multiple associated items that are listed.

In order to make the objectives, technical solutions, and advantages of the present invention clearer, specific implementation manners of the present invention will be further described in detail below with reference to the accompanying drawings.

A lossless compression method for a test vector provided by the present invention comprises following steps:

S01: converting the test vector into a data stream with A rows and B columns, the data stream is expressed in binary; wherein each of the B columns represents test datum of a test channel at a time differently; each of the A rows represents test datum of a test channel differently at the same time; both A and B are integers greater than 1.

The method of the present invention is suitable for compressing and decompressing ATE test datum, a feature of an ATE test vector is that binary datum of the ATE test vector is a high inheritance along a column direction, which means it is not necessary to switch test datum frequently, but keep current values for most of the test channels. Test datum of each of the B columns change very little or very slowly, which can be compressed. And among the B columns, that is, along a row direction, for test datum of each of the test channels are complete independent, which cannot be compressed.

Therefore, the method of the present invention adopts compressing test datum of each of the B columns, in order to shorten compression and decompression times, each of the B columns can be divided into multiple slices, so as to be compressed and decompressed independently, and then converged according to a slice order. A specific operation is as follows: dividing the A rows and the B columns of the data stream into N slices, and each of the N slice comprises a data stream with A/N rows and B columns, A/N is a positive integer greater than M.

S02: compressing the data stream a column by a column sequentially to form compressed words and uncompressed words corresponding to test datum of each of the B columns. When the data stream is divided into the N slices, the N slices can be compressed in N compression units to obtain N compressed data modules. Wherein, the test datum of each of the B columns are compressed by each of the N compression units separately, and operation of each of the N compression units is the same. Compression of the test datum of each of the B columns in the present invention can be performed independently, which is very convenient for a parallel processing on a FPGA and is also suitable for a multi-thread processing of a CPU.

A specific compression method for the test datum of each of the B columns as follows:

S021: setting a window with a width of 1 bit and a depth of M rows, and sliding the window down a row by a row from top of test datum of a column, during adding M−1 bits of datum to the window, if both 0 and 1 in the M−1 bits datum, compression is not performed, so as to form M bits of the uncompressed words, wherein in the uncompressed words, M−1st bit data represents a compression mark, and datum from M−2nd bit to 0th bit represent the M−1 bits of the datum correspondingly in the window;

if either 0 or 1 in the M−1 bits datum, the compression is performed, and the window is pulled down a row by a row continually until a data added latest in the window is different from test datum in other rows in the window or pulled down to bottom of the test datum of the column to form M bits of the compressed words, wherein, M−1st bit data in the compressed words represents the compression mark, M−2nd bit data represents a compressed character, and in a binary data stream, a compressed character is 0 or 1, which means that 0 or 1 is compressed, datum form M−3rd bit to 1st bit represent cnt, which is number of compressed characters in the M−1 bits of the datum; 0th bit data represents the mantissa of the data added latest in the window. When the window is pulled down the row by the row, if the data added latest in the window is the same as datum in other rows in the window, the number of the compressed characters (cnt) plus 1.

compression marks in the compressed words and the uncompressed words are different from compression marks in the uncompressed words. For example, 0 can be used to represent that the compression is not performed, and 1 can be used to represent that the compression is performed.

S022: after forming the compressed words or the uncompressed words, sliding the window to an unprocessed row of the test datum of the column, and repeating step S021 until the window is pulled down to the bottom of the test datum of the column to obtain compressed datum of the test datum of each of the B columns; M is a positive integer greater than 2 and less than A. The compressed data of the test datum of each of the B columns in the present invention may contain only the compressed words or only the uncompressed words or both the compressed words and the uncompressed words, and the compressed words and the uncompressed words in the compressed datum are arranged in a formed order sequentially.

S03: converging the compressed datum of the test datum of each of the B columns to form a compressed data stream. When the data stream is divided into the N slices, the compressed data module formed by compression of each of the N slices comprises B columns of compressed datum, compressed datum of each of the B columns of compressed datum for each of the N slices is arranged in a column order of the B columns, during converging the compressed datum, the N compressed data modules are arranged in the slice order of the N slices, and compressed datum modules corresponding to adjacent slices are separated by inserting the compression marks, so as to form a complete compressed data stream.

A lossless decompression method provided by the present invention based on the compression method mentioned above, which comprises following steps:

T01: decompressing the compressed datum of each of the B columns in a column order of the B columns, which comprises following steps:

for the uncompressed words, after removing the M−1 st bit data, remaining datum from the M−2nd bit to the 0th bit are decompressed datum;

for the compressed words, extending the compressed characters in the compressed words to cnt bit, and plus the mantissa of the 0th bit data in the compressed words, so as to form the decompressed datum;

converging the compressed datum of each of the B columns in the column order of the B columns to obtain column datum of decompressed datum after decompressing.

During compressing, the data stream with the A rows and the B columns is divided into the N slices, and each of the N slices comprises A/N rows and B columns of the data stream, and each of the N slices is compressed by each of the N compression units correspondingly to obtain the N compression data modules, before performing the decompressing in T01, it is necessary to receive the N compressed data modules respectively, and decompress the N compressed data modules by the N decompression units to obtain the N decompressed data modules correspondingly. Each of the N compressed data modules is isolated by inserting the compression marks, thus it is still easy to distinguish each of the N compressed data modules in the complete compressed data stream.

For each of the N compressed data modules received, it is necessary to analyze bit numbers of the compressed words and the uncompressed words received sequentially. If the bit numbers of the compressed words and the uncompressed words received sequentially is equal to A/N, then the compressed words and the uncompressed words received are test datum of a column in a compressed data module correspondingly, wherein, bit number of the uncompressed words is equal to M−1 bit, and bit number of the compressed words is equal to the number of compressed characters in the compressed word (cnt) plus 1. The method of decompressing the compressed datum of the test datum of each of the B columns in the compressed data modules is shown as mentioned above.

T02: repeating step T01 to obtain B columns of datum and converging the B columns of the datum into a data stream with A rows and B columns. For the data stream compressed comprises the N compressed data modules, each of the N compressed data modules has been distinguished by columns when it is received, and decompressed modules after decompressing the N compressed data modules are spliced seamlessly according to the columns correspondingly, then columns in the complete data stream is obtained, so as to be converged into A rows and B columns of the data stream.

The present invention is further explained below through a specific embodiment 1, a compression algorithm for the vector data used in embodiment 1 is named VS CX-1613.

Embodiment 1

A lossless compression method for a test vector provided by the present invention comprises following steps:

S01: converting the test vector into a data stream with A rows and B columns, the data stream is expressed in binary; wherein each of the B columns represents test datum of a test channel at a time differently; each of the A rows represents test datum of a test channel differently at the same time; both A and B are integers greater than 1.

As shown in FIG. 1, the data stream with the A rows and the B columns is divided into the N slices. The N slices comprises the A/N columns and B columns of the data stream, and A/N is a positive integer greater than M. Taking the VSCX-1613 algorithm as an example, 8000 rows are usually used as a slice, that is, A/N is 8000.

S02: compressing the data stream a column by a column sequentially to form compressed words and uncompressed words corresponding to test datum of each of the B columns; a compression method for the test datum of each of the B columns comprises.

The compressed words and the uncompressed words formed by the VSCX-1613 algorithm in the present invention are both 16 bits words, and meanings of each of the bits are shown in Table 1 and Table 2:

TABLE 1

Meaning of each of bits of compressed words in a VSCX-1613 algorithm

| bit | name | remark |
| --- | --- | --- |
| 15 | compression mark = 1 | 0: uncompressed; 1: compressed |
| 14 | compressed character | 0: compressed to 0; 1: compressed to 1 |
| 13:1 | cnt | number of the bits is 0 (0~8191) |
| 0 | mantissa | bit number of the mantissa is 1 bit |

TABLE 2

Meaning of each of bits of uncompressed words in a VSCX-1613 algorithm

| bit | name | remark |
| --- | --- | --- |
| 15 | compression mark = 0 | 0: uncompressed; 1: compressed |
| 14:0 | raw datum | bit number of the raw datum is 15 bits |

Figure 2:
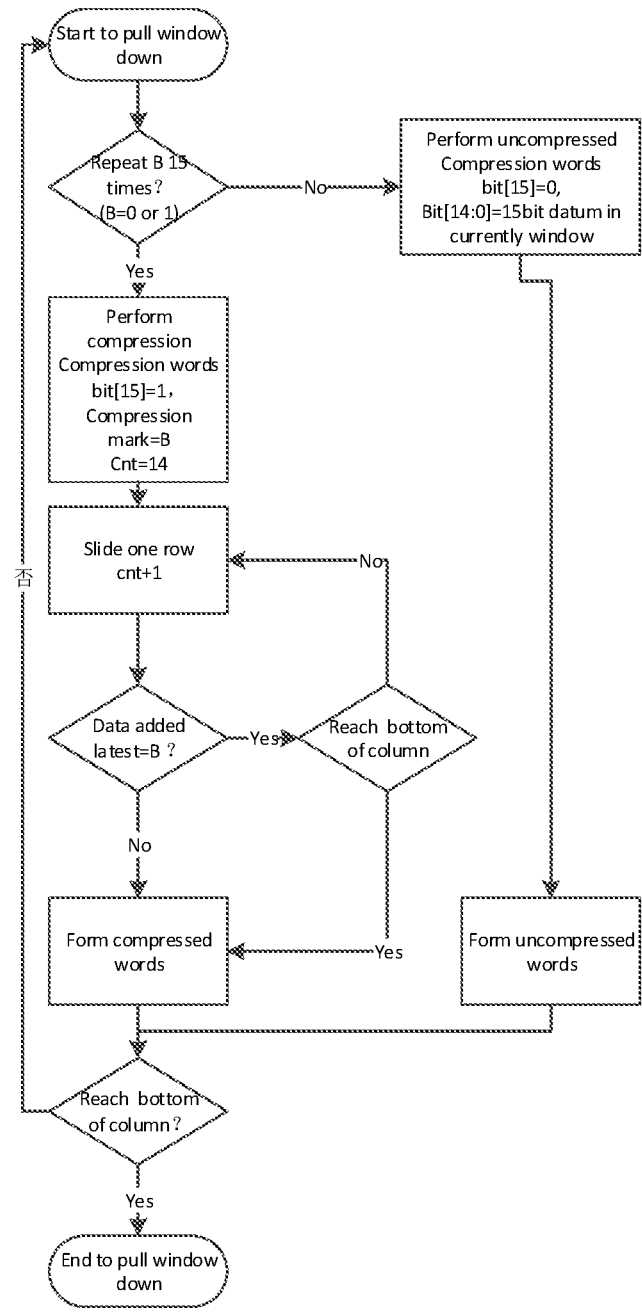
FIG. 2 is a schematic diagram of a method for compressing each test data of columns in Embodiment 1.

As shown in FIG. 2, a specific compression method for datum of each of the columns as follows:

S021: setting a window with a width of 1 bit and a depth of 16 rows, and sliding the window down a row by a row from top of test datum of a column, during adding 15 bits datum to the window, if both 0 and 1 in the 15 bits datum, compression is not performed, so as to form 16 bits of the uncompressed words, wherein, 15st bit in the uncompressed words represents the compression mark, and datum from 14th bit to 0th bit represent the 15 bits datum correspondingly in the window;

if either 0 or 1 in the 15 bits datum, the compression is performed, and the window is pulled down the row by the row continually until the data added latest in the window is different from test datum in other rows in the window or pulled down to bottom of the test datum of the column to form 16 bits of the compressed words, wherein, 15th bit in the compressed words represents the compression mark, 14th bit represents the compressed character, which is 0 or 1; datum from 13th to 1st bit represent cnt, which is the number of the compressed characters in the 15 bits datum; 0th bit data represents the mantissa of the data added latest in the window; When the window is pulled down the row by the row, if the data added latest in the window is the same as datum in other rows in the window, the number of the compressed characters (cnt) plus 1.

Figure 3:
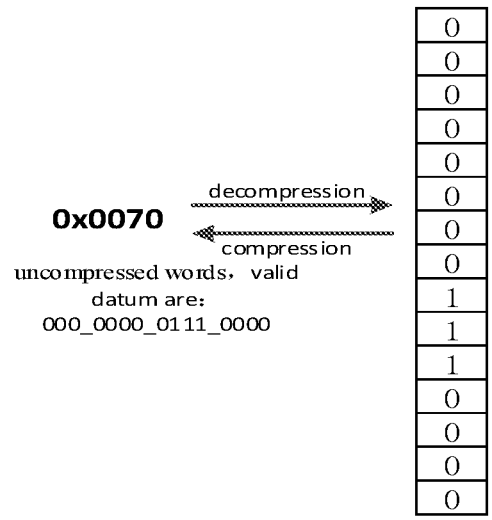
FIG. 3 is a schematic diagram of forming uncompressed words in Embodiment 1.

As shown in FIG. 3, when the 15-bit datum added to the window is different, uncompressed words 0x0070 is formed.

Figure 4:
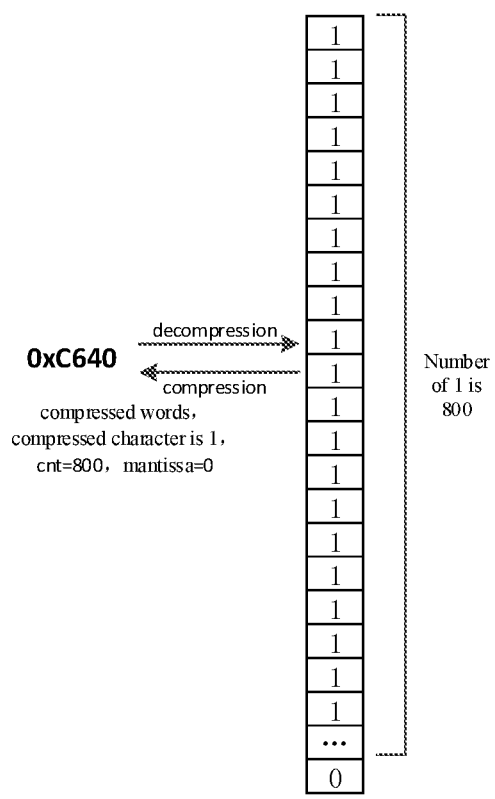
FIG. 4 is a schematic diagram of forming compressed words in Embodiment 1.

As shown in FIG. 4, when the 15-bit datum added to the window is the same, a schematic diagram of forming compressed words 0xC640 is added to the window.

S022: after forming the compressed words or the uncompressed words, sliding the window to an unprocessed row of the test datum of the column, and repeating step S021 until the window is pulled down to the bottom of the test datum of the column, so as to form compressed datum of the test datum of each of the columns; M is a positive integer greater than 2 and less than A.

The compressed words and uncompressed words in each column of compressed data in the present invention are arranged in the formed order sequentially.

Figure 5:
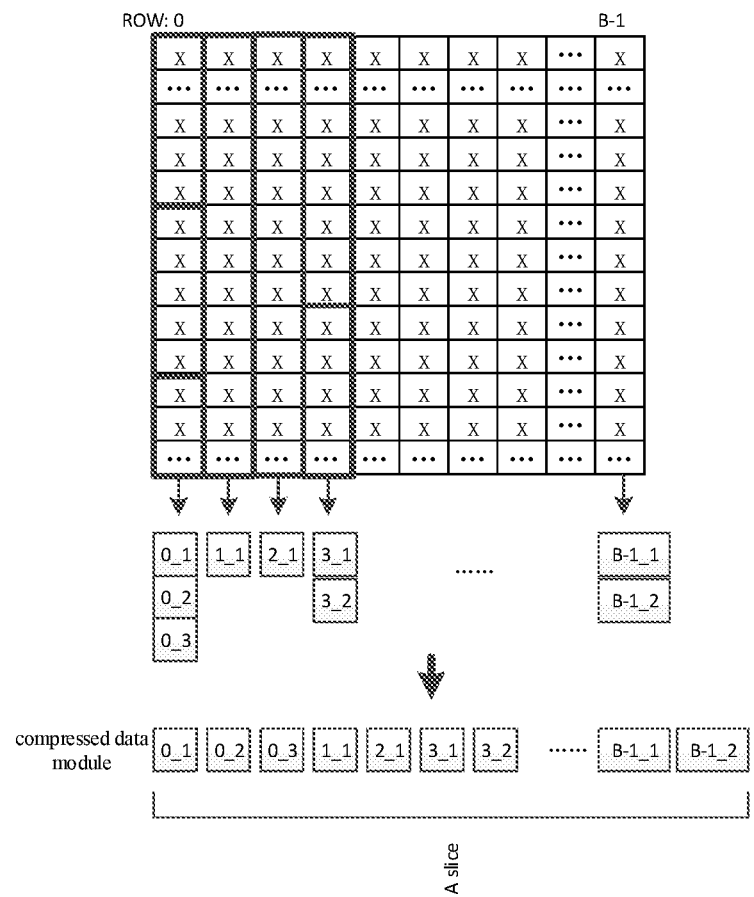
FIG. 5 is a schematic diagram of compressing a slice to form a compressed data module correspondingly in Embodiment 1.

S03: As shown in FIG. 5, converging the compressed datum of the test datum of each of the columns, so as to form the compressed data stream.

Figure 6:
FIG. 6 is a schematic diagram of forming a complete compressed data stream by N slices in Embodiment 1.

As shown in FIG. 6, when converging the compressed datum, the N compressed data modules are arranged in the slice order of the N slices, and compressed data modules corresponding to adjacent slices are separated by inserting the compression marks, such as 0X8000 (0X8000 is not used normally in the compressed words), so as to form the complete compressed data stream.

Figure 7:
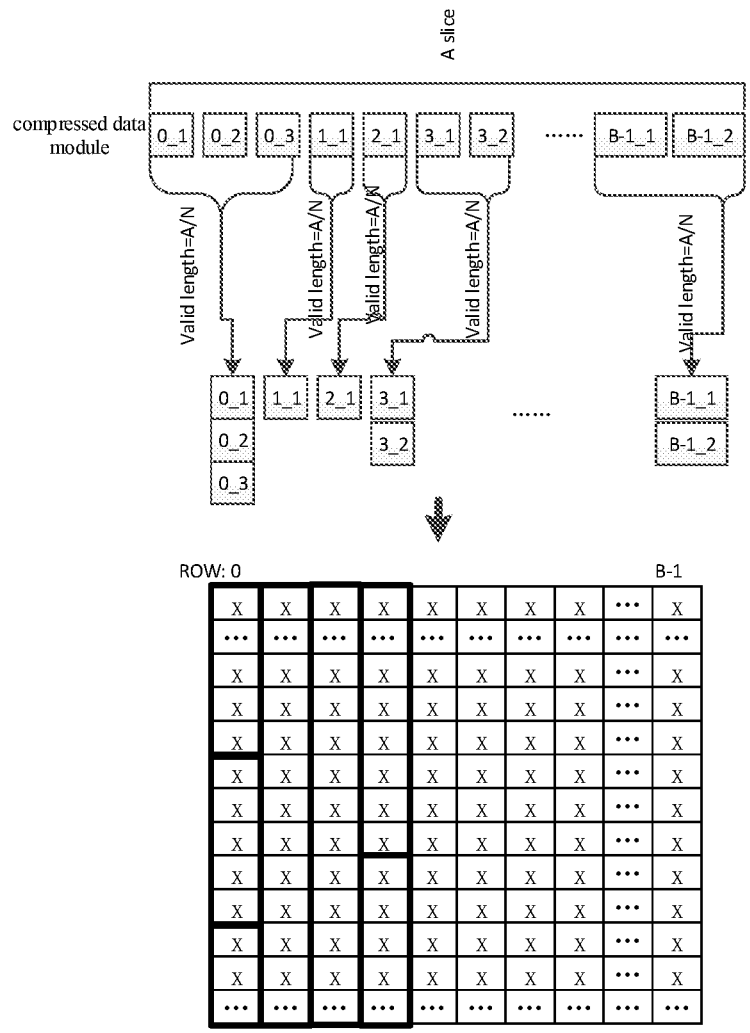
FIG. 7 is a schematic diagram of decompressing a compressed data module corresponding to a slice in Embodiment 1.

A lossless decompression method provided by the present invention based on the compression method mentioned above, which comprises following steps:

As shown in FIG. 7, T01: receiving the N compressed data modules respectively, and decompressing the N compressed data modules by the N decompression units, so as to form the N decompressed data modules correspondingly. Each of the N compressed data modules is isolated by inserting the compression marks in the complete compressed data stream, it is easy to distinguish the N compressed data modules in the complete compressed data stream. For each of the N compressed data module received, it is necessary to analyze the bit numbers of the compressed words and the uncompressed words received sequentially, if the bit numbers of the compressed words and the uncompressed words received sequentially is equal to A/N, the compressed words and the uncompressed words received are a column of datum in the compressed data module, wherein, the bit number of the uncompressed words is equal to M−1 bit, and the bit number of the compressed words is equal to the number of compressed characters in the compressed words (cnt) plus 1. The decompression method for the compressed data of each of the B columns in the compressed data module is shown above.

Decompressing the compressed data of the test datum of each of the B columns in the column order comprises:

for the uncompressed words, after removing the 15th bit, the datum from 14th bit to 0th bit of the test datum remaining are the decompressed data;

for the compressed words, the compressed characters in the compressed words are extended to cnt bit, and plus the mantissa of the 0th bit data in the compressed words, so as to form decompressed datum;

converging the decompressed data of the test datum of each of the columns in the column order, so as to form the column datum after decompressing.

T02: after decompressing the N compressed data modules, the N decompressed modules are seamlessly spliced in the column order, thus the corresponding columns in the complete data stream can be obtained, so as to be combined into the data stream with the A rows and the B columns.

In the embodiment 1, a theoretical optimal compression ratio is 0.2%; (all of datum in each of the B columns is 0 or 1); a theoretical worst compression ratio is 106.7%; (no more than 13 consecutive 0 or 1 in each of the B columns); a practical compression ratio in used is around 2%. The present invention provides a method for lossless compression and decompression of a test vector, which utilizes the feature of the ATE test vector is the high inheritance along the column direction, and adopts a compression algorithm of the data stream sliding along the column direction, which can realize lossless compression and decompression, and processes of the compression and the decompression are simple and fast, thus are suitable for field of ATE testing.

Other embodiments of the disclosure will be apparent to those skilled in the art from consideration of the specification and practice of the disclosure here. This application is intended to cover any variations, uses, or adaptations of the disclosure following the general principles thereof and including such departures from the disclosure as come within known or customary practice in the art. It is intended that the specification and embodiments be considered as exemplary only, with a true scope and spirit of the disclosure being represented by the following claims.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A lossless compression method for a test vector, comprises following steps:
    S01: converting the test vector into a data stream with A rows and B columns, the data stream is expressed in binary; wherein each of the B columns represents test datum of a test channel at a time differently; each of the A rows represents test datum of a test channel differently at the same time; both A and B are integers greater than 1;
    S02: compressing the data stream a column by a column sequentially to form compressed words and uncompressed words corresponding to test datum of each of the B columns; a compression method for the test datum of each of the B columns comprises:
    S021: setting a window with a width of 1 bit and a depth of M rows, and sliding the window down a row by a row from top of test datum of a column, during adding M−1 bits of datum to the window,
    if both 0 and 1 in the M−1 bits datum, compression is not performed, so as to form M bits of the uncompressed words, wherein in the uncompressed words, M−1st bit data represents a compression mark, and datum from M−2nd bit to 0th bit represent the M−1 bits of the datum correspondingly in the window;
    if either 0 or 1 in the M−1 bits datum, the compression is performed, and the window is pulled down a row by a row continually until a data added latest in the window is different from test datum in other rows in the window or pulled down to bottom of the test datum of the column to form M bits of the compressed words, wherein, M−1 st bit data in the compressed words represents the compression mark, M−2nd bit data represents a compressed character, datum form M−3rd bit to 1st bit represent cnt, which is number of compressed characters in the M−1 bits of the datum; 0th bit data represents the mantissa of the data added latest in the window;
    S022: after forming the compressed words or the uncompressed words, sliding the window to an unprocessed row of the test datum of the column, and repeating step S021 until the window is pulled down to the bottom of the test datum of the column to form compressed datum of the test datum of each of the B columns; M is a positive integer greater than 2 and less than A;
    S03: converging the compressed datum of the test datum of each of the B columns to form a compressed data stream.

2. The lossless compression method of claim 1, wherein, between step S01 and step S02, further comprises: dividing the data stream with the A rows and the B columns into N slices, and each of the N slices comprises a data stream with A/N rows and B columns, in step S02, the N slices are compressed respectively by N compression units to form N compressed data modules; A/N is a positive integer greater than M.

3. The lossless compression method of claim 2, wherein, in step S03, arranging the N compressed data modules in an order of the N slices, and separating the N compressed data modules corresponding to adjacent slices by inserting compression marks.

4. The lossless compression method of claim 1, wherein, compression marks in the compressed words is different from compression marks in the uncompressed words.

5. The lossless compression method of claim 1, wherein, in step S021, during sliding the window down a row by a row, the data added latest in the window is the same as datum in other rows in the window, and the number of the compressed characters (cnt) plus 1.

6. A lossless decompression method for a test vector compressed according to the method of claim 1, comprises following steps:
    T01: decompressing the compressed datum of the test datum of each of the B columns in a column order of the B columns, comprising:
    for the uncompressed words, after removing the M−1st bit data, remaining datum from the M−2nd bit to the 0th bit are decompressed datum;
    for the compressed words, extending the compressed characters in the compressed words to cnt bit, and plus the mantissa of the 0th bit data in the compressed words to form the decompressed datum;
    converging the decompressed datum of the test datum of each of the B columns in the order of the B columns to form column datum of decompressed datum after decompression;
    T02: repeating step T01 to obtain B columns of the column datum and converging the B columns of the column datum to form the data stream with the A rows and the B columns.

7. The lossless decompression method of claim 6, wherein, during a compression, dividing the data stream with the A rows and the B columns into N slices, and each of the N slice comprises a data stream with A/N rows and B columns, the N slices are compressed respectively by N compression units to form N compressed data modules; A/N is a positive integer greater than M;
    in step T01, the N compressed data modules are decompressed respectively by N decompression units to form N decompressed data modules correspondingly.

8. The lossless decompression method of claim 7, wherein, before step T01, further comprises receiving the N compressed data modules, wherein, during receiving each of the compressed data module, bit numbers of the compressed words and the uncompressed words received sequentially are analyzed, if bit numbers of the compressed words and the uncompressed words received sequentially are equal to A/N, thus both the compressed words and the uncompressed words received are test datum of a column, wherein, the bit number of the uncompressed words is equal to M−1 bit, and the bit number of the compressed words is equal to the number of compressed characters in the compressed word (cnt) plus 1.

9. The lossless decompression method of claim 8, wherein, decompressing each of the N compressed data modules a row by a row sequentially, and splicing the column datum of decompressed datum correspondingly by the N decompressed data modules seamlessly after the decompression to form the column datum of the decompressed datum corresponding to the columns.

* * * * *